(12) United States Patent
Willis et al.

(10) Patent No.: US 9,784,601 B2
(45) Date of Patent: Oct. 10, 2017

(54) APPARATUS AND METHOD FOR SIGNAL SYNCHRONIZATION

(71) Applicant: Computational Systems, Inc., Knoxville, TN (US)

(72) Inventors: John W. Willis, Oak Ridge, TN (US); Michael D. Medley, Knoxville, TN (US); Anthony J. Hayzen, Knoxville, TN (US); Deane M. Horn, Knoxville, TN (US)

(73) Assignee: Computational Systems, Inc., Knoxville, TN (US)

( * ) Notice: Subject to any disclaimer, the term of this patent is extended or adjusted under 35 U.S.C. 154(b) by 491 days.

(21) Appl. No.: 14/549,107

(22) Filed: Nov. 20, 2014

(65) Prior Publication Data
US 2016/0146646 A1    May 26, 2016

(51) Int. Cl.
*G01D 21/00* (2006.01)
*G01H 1/00* (2006.01)
*G05B 15/02* (2006.01)
*H03M 1/00* (2006.01)

(52) U.S. Cl.
CPC ............ *G01D 21/00* (2013.01); *G01H 1/003* (2013.01); *G05B 15/02* (2013.01); *H03M 1/00* (2013.01)

(58) Field of Classification Search
None
See application file for complete search history.

(56) References Cited

U.S. PATENT DOCUMENTS

| | | | | |
|---|---|---|---|---|
| 5,150,313 A | * | 9/1992 | van den Engh | ... G01N 15/1456 702/79 |
| 5,610,826 A | * | 3/1997 | Whetsel | ............ G01R 31/3163 702/117 |
| 5,854,994 A | * | 12/1998 | Canada | .................. G01H 1/003 340/3.63 |
| 6,801,042 B2 | * | 10/2004 | McPherson | ............ G01R 35/02 324/601 |

(Continued)

OTHER PUBLICATIONS

A Distributed System, Bruel & Kjaer, http://www.bksv.com/products/frontends/lanxi/sample-systems/distributed-system, Accessed Feb. 23, 2015.

(Continued)

*Primary Examiner* — Andres Munoz
(74) *Attorney, Agent, or Firm* — Luedeka Neely Group, P.C.

(57) ABSTRACT

A system is described for time synchronizing digitized measurement signals, such as vibration signals. The digitized signals, which are acquired asynchronously by multiple distributed measurement units, indicate the operational condition of a machine or a process. To measure the phase of the digitized signals relative to a pulse tachometer input, the time between the leading edge of the tachometer pulse and the digitized samples is measured. To achieve phase-coherent synchronization across the distributed measurement units, a local synchronization signal is embedded into the data produced by the measurement units. The systems uses the synchronization signal to align the data in post processing, which phase aligns the data and aligns the data in absolute time. The synchronization signal may be encoded with a timestamp to provide additional timing information.

10 Claims, 5 Drawing Sheets

(56) References Cited

U.S. PATENT DOCUMENTS

| | | | | |
|---|---|---|---|---|
| 6,912,474 B2* | 6/2005 | Richmond | ............... | G06F 11/25 369/47.35 |
| 7,610,175 B2* | 10/2009 | Eidson | ............... | G01R 19/2509 324/76.11 |
| 7,933,728 B2* | 4/2011 | Ishida | ............... | G01R 25/005 324/754.19 |
| 8,265,888 B2* | 9/2012 | Chung | ............... | G01F 1/34 137/2 |
| 8,996,745 B2* | 3/2015 | Decker | ............... | G05B 19/056 710/9 |
| 9,379,726 B1* | 6/2016 | Wang | ............... | H03M 1/125 |
| 9,435,684 B2* | 9/2016 | Baldwin | ............... | G01H 1/003 |
| 9,553,600 B1* | 1/2017 | Lacroix | ............... | H03M 1/0624 |
| 2006/0150738 A1* | 7/2006 | Leigh | ............... | G01H 1/14 73/649 |
| 2010/0030509 A1* | 2/2010 | Crain, II | ............... | G06F 19/00 702/123 |
| 2011/0098968 A1* | 4/2011 | Srinivasa | ............... | G01H 1/003 702/145 |

OTHER PUBLICATIONS

Miller, Scott et al. Practical, Inexpensive, Nanosecond Time-Accuracy Using GPS, New Mexico Institute of Mining and Technology, http://infohost.nmt.edu/~sfs/Students/ScottMiller/Papers/EMCW_paper.pdf, Accessed Feb. 23, 2015.

* cited by examiner

APPARATUS AND METHOD FOR SIGNAL SYNCHRONIZATION

FIELD

This invention relates to time synchronization of vibration waveforms in the time domain using synchronization pulses.

BACKGROUND

In making measurements of vibration characteristics of a machine having rotating components, the phase of a vibration signal is generally defined as the angular relationship between an amplitude peak in the vibration signal and a once-per-revolution reference signal, such as produced by a tachometer sensor.

In most vibration measurement systems, the vibration signal from a vibration sensor is converted to a digital signal using an analog-to-digital converter (ADC). Generally, to attain an accuracy of one degree at a rotational speed of 2 KHz, this time measurement must fix the tachometer leading edge relative to the ADC samples with a resolution of better than one microsecond.

In situations in which data are collected by multiple data acquisition systems running asynchronously, the data acquisition processes are not synchronized, and there is no way to directly compare the phase of the data collected by the asynchronous systems. In such a case, even if the tachometer edges are aligned, a comparison of data from the two systems would still be skewed, especially during non-steady-state operation.

What is needed, therefore, is a system for accurately aligning tachometer pulses associated with vibration signal data collected by multiple data acquisition systems that are running asynchronously.

SUMMARY

In systems incorporating preferred embodiments of the present invention, to measure the phase of a digitized signal, such as a vibration signal, relative to a pulse tachometer input, the time between the leading edge of the tachometer pulse and the ADC samples is measured as depicted in FIG. 1. Generally, to attain an accuracy of one degree at a rotational speed of 2 KHz, this time measurement must fix the tachometer leading edge relative to the digitized signal samples with a resolution of better than one microsecond.

Using an external synchronization pulse, when data is re-aligned in post processing, the data is both phase aligned and correctly aligned in absolute time. To provide extra timing information, it is possible to encode synchronization signals using a count code or timestamp.

To achieve phase coherent synchronization across distributed units, two additional functions are required. First a method must be added to embed a local synchronization signal into the data being produced by the data acquisition unit. Second, a method must be added to align the (asynchronous) synchronization signals across distributed units.

Some embodiments of the invention described herein provide an apparatus for time synchronizing measurement signals that are indicative of an operational condition of a machine or process. A preferred embodiment of the apparatus comprises at least a first measurement device and a second measurement device that are acquiring measurement signals asynchronously, and a host processor synchronizing and processing the measurement signals.

The measurement device includes a sensor, an ADC clock, an analog-to-digital converter, a tachometer sensor, a synchronization clock source, a signal processor, and a media access controller. The sensor is attached to the machine or process and generates a analog measurement signal. The ADC clock generates a ADC clock signal. The analog-to-digital converter receives the ADC clock signal and the analog measurement signal and generates a digital measurement signal. The tachometer sensor is attached to the machine or process and generates a tachometer signal comprising tachometer pulses. The synchronization clock source generates a synchronization signal comprising synchronization pulses.

The signal processor, which is preferably a Signal Processing FPGA, performs synchronization timing by measuring time between several inputs. A time delay is measured from the sync pulse edge to the next ADC sample. This delay measurement consists of the number of ADC clock cycles between the sync pulse and ADC sample. This measurement establishes a reference from the sync pulse to the ADC clock. A delay time is calculated from the sync pulse to the next filtered output data sample produced by the Signal Processing FPGA. This determines the total signal processing delay, including the group delay of the ADC and the group delay of the digital filters employed by the Signal Processing FPGA. A time delay is measured between the sync pulse edge and any tachometer pulses that occur within the sync pulse interval.

The sync pulse is also connected to the trigger input of an IEEE1588 Media Access Controller (MAC) of the host processor. Each sync pulse latches the current count of the IEEE1588 timer. IEEE1588 operates by synchronizing high speed counters in various devices on an IEEE1588 network. These counters are implemented in the Ethernet MAC (Media Access Controller) which supports this feature. Since these counters are all synchronized to the same global clock, these timers may be used as a timing reference between systems. In the Machinery Health Management (MHM) system, the synchronization pulse utilized by the Signal Processing FPGA is also fed to the trigger input of the IEEE1588 MAC. When the pulse is detected, the current IEEE1588 counter value is latched by the IEEE1588 MAC. The host processor may now read this latched timer value from the IEEE1588 MAC and construct a data record of synchronization pulses and IEEE1588 timestamps.

BRIEF DESCRIPTION OF THE DRAWINGS

Other embodiments of the invention will become apparent by reference to the detailed description in conjunction with the figures, wherein elements are not to scale so as to more clearly show the details, wherein like reference numbers indicate like elements throughout the several views, and wherein.

DETAILED DESCRIPTION

Figure 1:
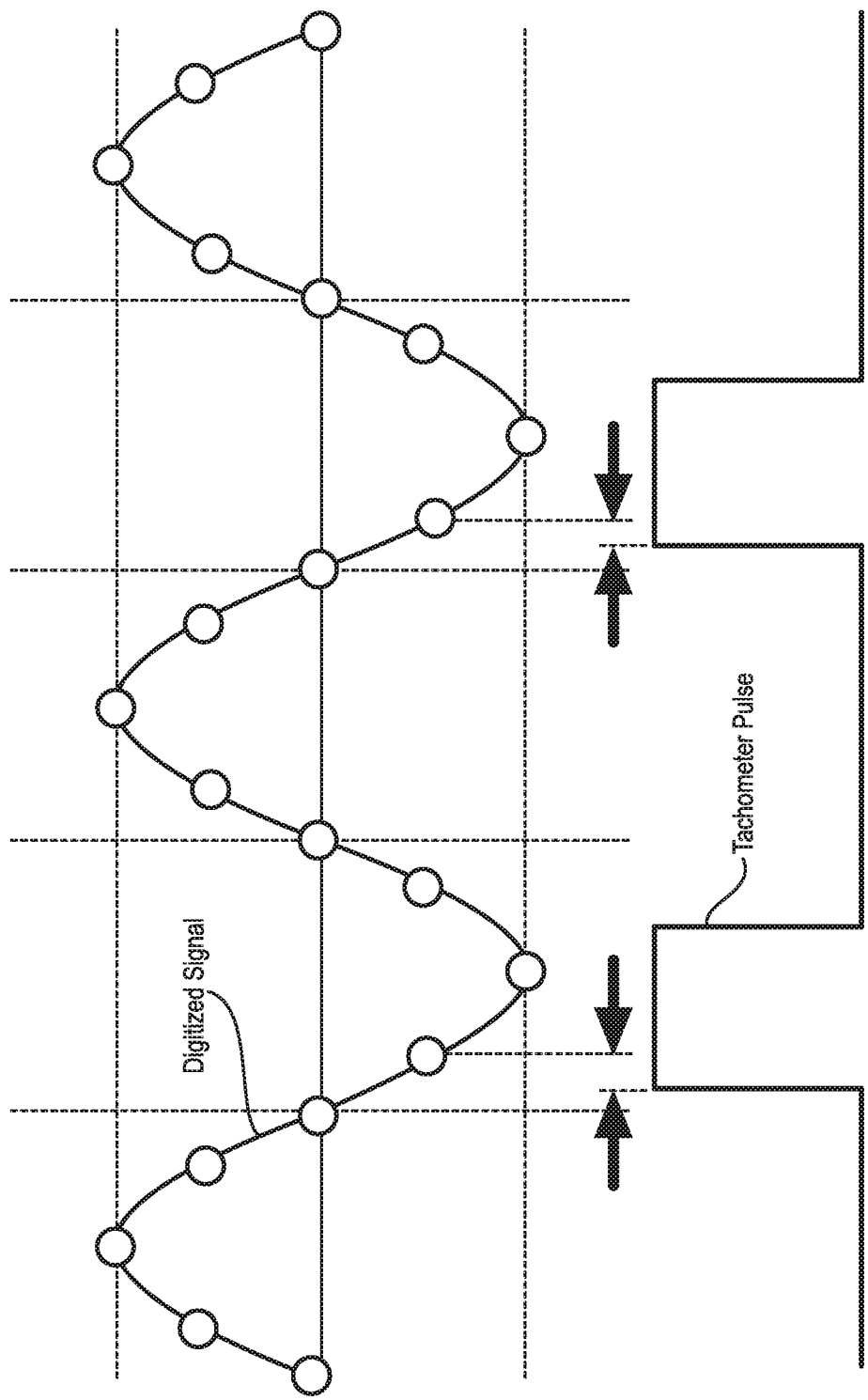
FIG. 1 depicts a phase measurement between a digitized signal and a tachometer pulse.
Figure 2:
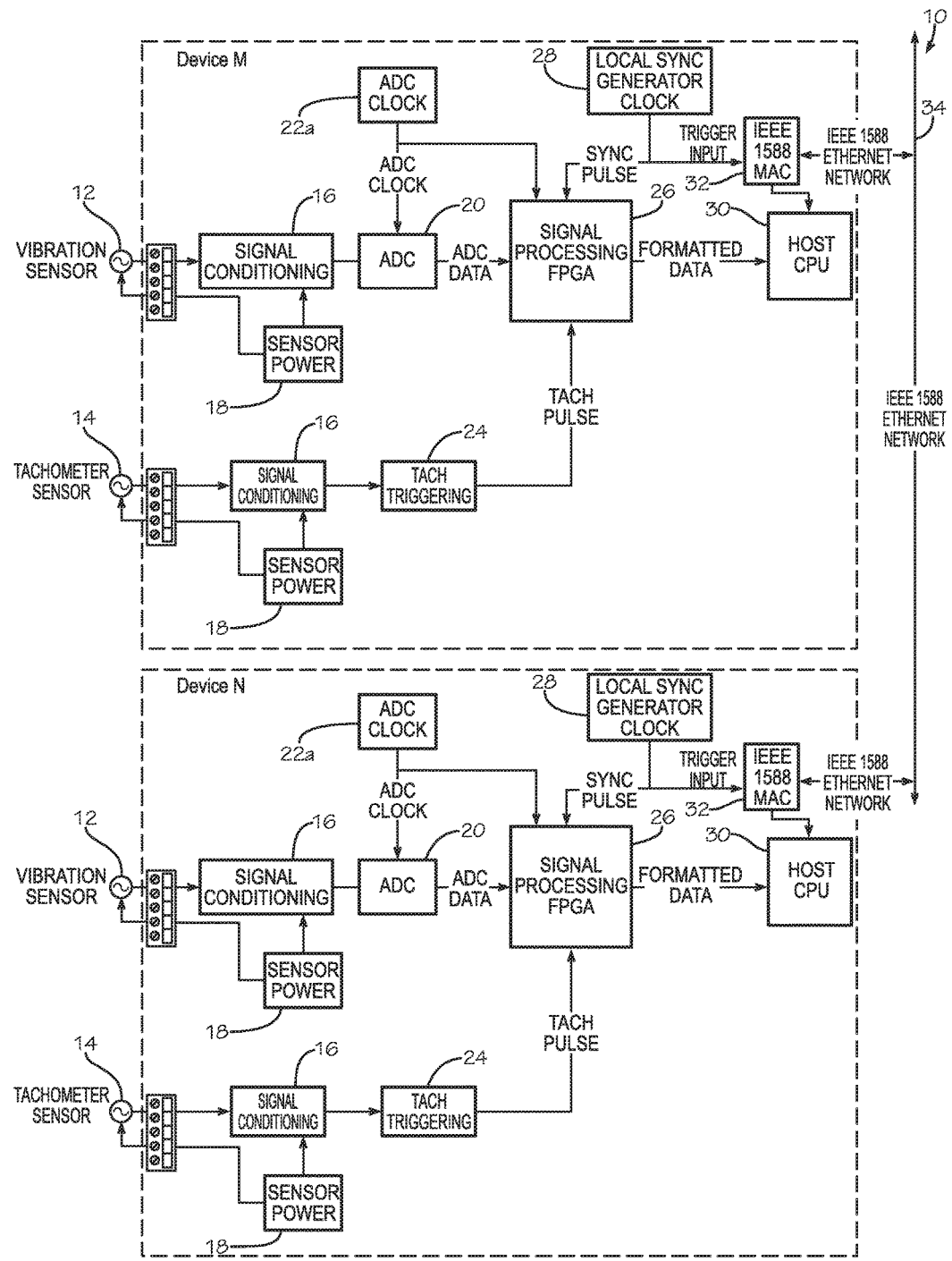
FIG. 2 depicts a data acquisition system for synchronizing data across distributed devices.

An exemplary system 10 for producing synchronized vibration information is shown in FIG. 2. In a preferred embodiment, the system shown incorporates multiple measurement devices referred to herein as Device M and Device N. Although only two measurement devices are depicted in FIG. 2, it will be appreciated that more than two measurement devices may be incorporated into the system 10.

The measurement device N includes one or more analog sensors 12, one or more tachometer sensors 14, signal conditioning circuitry 16, one or more sensor power sources 18, one or more analog-to-digital converters (ADC) 20, one or more ADC clock sources 22, a synchronization clock source 28, a signal processor 26, which in a preferred embodiment is a field programmable gate array (FPGA), a host CPU 30, and an Ethernet media access controller (MAC) 32 compatible with IEEE1588, including an external trigger input. The Ethernet MAC 32 is connected to an IEEE1588 Ethernet network 34.

The analog sensors 12 are preferably sensory detection devices that translate sensory information into an electric voltage or an electric current. Analog sensors or other transducers suitable for use in the present invention may include various kinds For example, they may measure a machine or a process or an environment vibration, such as is commonly done using an eddy current probe or an accelerometer. These are examples of analog sensors 12 of preferred embodiments. Alternative embodiments of analog sensors 12 measure a machine or a process or an environment around a machine or a process, such as a motor current signature, a passive or a pulse-echo ultrasonic measure, a magnetic flux signature, a temperature, a pressure, a flow, a mass, a relative humidity, a load, a density, a composition, a physical property, a chemical property, an electrical property, a magnetic property, an optical property, or an electromagnetic property. Analog sensors 12 of preferred embodiments may be passive or active detector types.

The tachometer sensors 14 may comprise rotational encoders, linear encoders, or other devices that discern a coordinate or a position or a rate of change. However, it is not necessary for all distributed units to use the tachometer input as discussed in more detail hereinafter.

Other digital data sources may include digital data streams, such as a process characteristic or measure, a control aspect or status, a switching event such as an initiation of a switch or a valve opening or closure, a measure of loading or power or energy or other operational information, an adaptive logic related characteristic, or other input that relates to or supports parallel synchronized data streams. These other digital data streams may incorporate a tachometer, encoder, beacon, timestamp, or other synchronization related information.

In a preferred embodiment, the signal processors 26 are field programmable gate arrays (FPGAs), which are particularly valuable for highly precise synchronization due to its speed of processing, speed of parallel channel configuration, and speed of parallel channel reconfiguration. The FPGA is a flexible field programmable and reconfigurable processor that is operable to switch back and forth between selectable high-pass to low-pass to band-pass signal filter settings, to switch between multiple decimation rates, to perform selective decimation such as PeakVue™, and to perform digital integration or differentiation as needed. In accordance with preferred embodiments of the present invention, the FPGA does all these things with precise synchronization between data streams from different devices, sources, and geographic locations. Various signal processing techniques are suitable for processing in the present invention, including but not limited to decimation, selective decimation, and anti-aliasing, as disclosed by Garvey, et. al., in "SELECTIVE DECIMATION AND ANALYSIS OF OVERSAMPLED DATA", U.S. patent application Ser. No. 14/252,943, filed Apr. 15, 2014, the entire contents of which are incorporated herein by reference.

Figure 3:
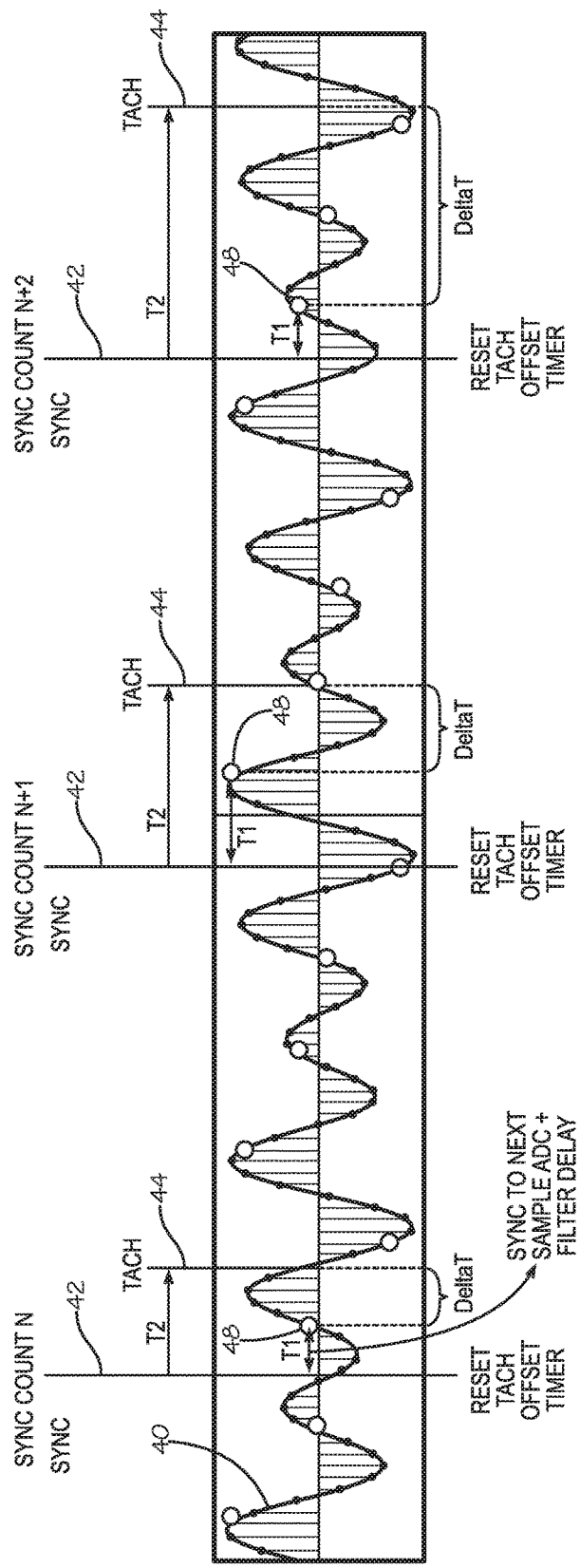
FIG. 3 depicts data processing performed by a signal processing FPGA to support synchronization.

FIG. 3 depicts an example of the data processing performed by the signal processor FPGAs 26 to enable synchronization. The FPGAs 26 perform synchronization timing by measuring time between the several inputs, including:
Waveform (ADC) data 40;
ADC clock signal(s) 48;
Synchronization pulses 42; and
Tachometer pulses 44.

When the periodic synchronization pulse 42 is detected by the FPGA 26, several measurements are performed as shown in FIG. 3.

A delay time 46 is measured from the synchronization pulse edge 42 to the next input ADC clock edge 48. This measurement establishes a reference from the synchronization pulse 42 to the ADC clock edge 48.

A delay time is calculated from the synchronization pulse 42 to the next filtered output data sample 48 produced by the FPGA 26. This determines the total signal processing delay, including the group delay of the ADC 20 and the group delay of digital filters employed by the FPGA 26.

A delay time is measured between the synchronization pulse edge 42 and any subsequent tachometer pulses.

Figure 4:
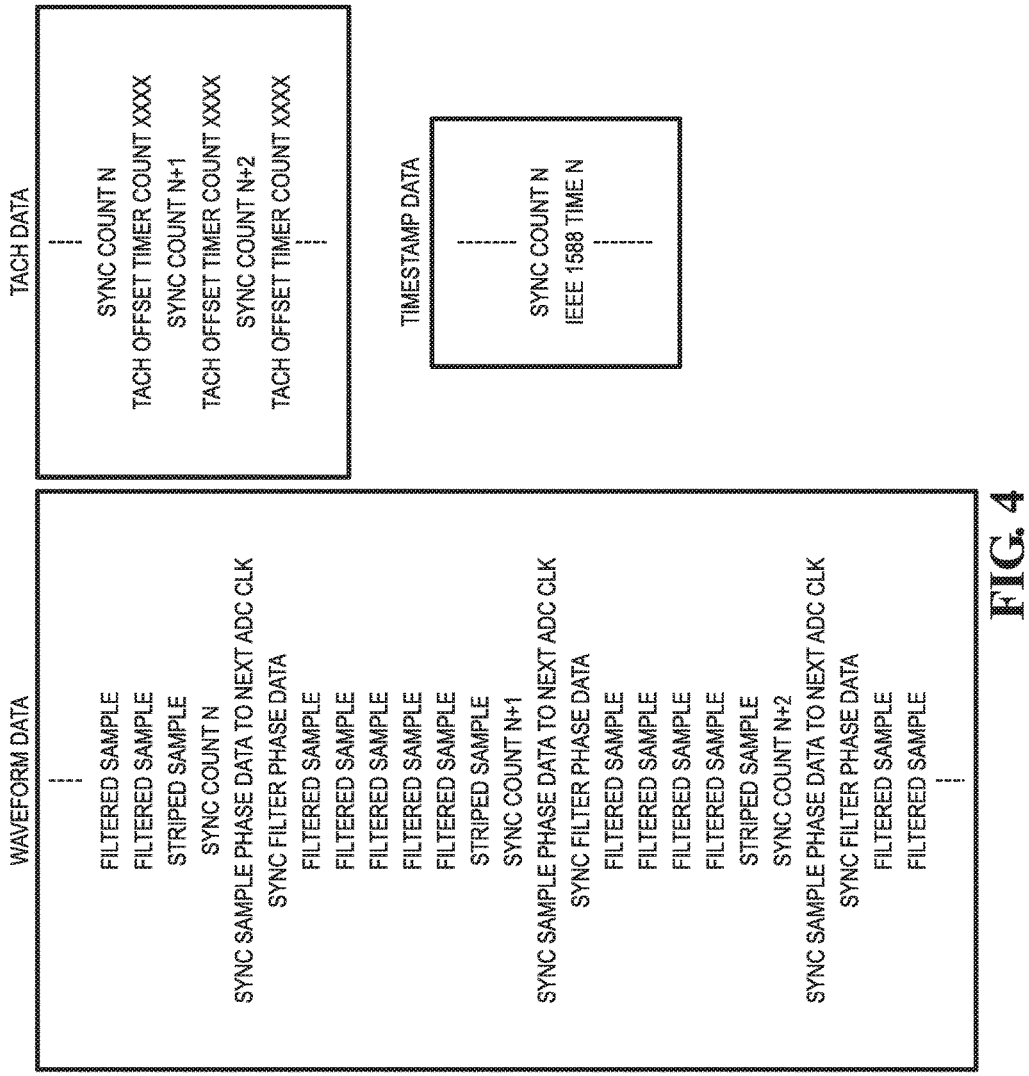
FIG. 4 depict waveform, tachometer and timestamp data structures showing embedded synchronization timing.

These offset times, which are embedded into the time waveform data as shown in FIG. 4, allow the calculation of phase between a signal and any local tachometer. In addition, a synchronization reference can be embedded in the data that allows synchronization across distributed devices.

The time delay (DeltaT) between the filtered data sample and the tachometer pulse edge is calculated as follows.

Time from Sync pulse 42 to filtered sample:

$$T1 = T\text{sync} + (T\text{ADCdelay} + T\text{PhaseDelay})$$

Time from Sync pulse 42 to tachometer edge 44:

$$T2 = T\text{sync} + T\text{TachOffset}$$

$$\text{Delta}T = T1 - T2 = (T\text{ADCdelay} + T\text{PhaseDelay}) - T\text{TachOffset}$$

To provide synchronization between devices, an IEEE1588 timestamp is added to the data. This is accomplished using an IEEE1588 subsystem that supports an external trigger input. The IEEE1588 subsystem synchronizes high-speed counters in various devices on the IEEE1588 network 34. These counters are implemented in the Ethernet MAC 32 that supports this feature. Since these counters are all synchronized to the same global clock, these timers may be used as a timing reference between systems.

In preferred embodiments, the synchronization pulse 42 utilized by the FPGA 26 is also fed to the trigger input of the IEEE1588 Ethernet MAC 32. When the pulse is detected, the current IEEE1588 counter value is latched by the MAC 32. The host processor 30 may read this latched timer value from the MAC 32 and construct a data record of synchronization pulses and IEEE1588 timestamps as depicted in FIG. 4.

Figure 5:
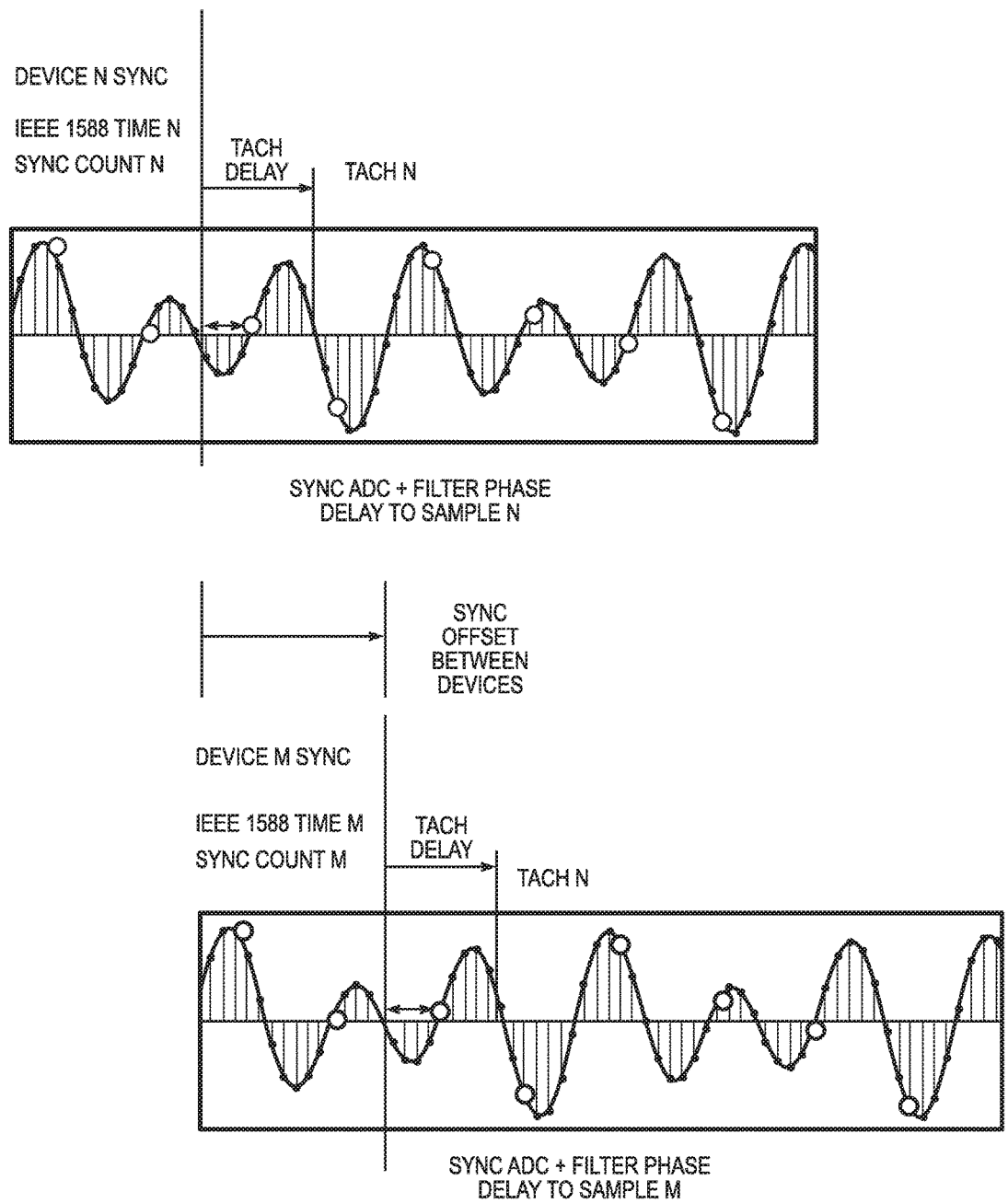
FIG. 5 depicts data alignment across distributed devices.

As shown in FIG. 5, data across devices (such as Device M and Device N) may be aligned using the IEEE1588 timestamp values to calculate the difference in time between the synchronization clocks on distributed devices. To align synchronization time across devices, the following calculation is performed:

$$\text{Sync delay } M = \frac{\text{IEEE1588 Time } N - \text{IEEE1588 Time } M}{M}$$

This synchronization time delay is added to all Device M data to align Device M data with the Device N synchronization pulse. When this correction has been made, data from the various devices may be aligned in time, allowing phase coherent analysis.

It should be noted that a local tachometer is no longer required to perform a phase measurement. Using the synchronization method, tachometer data collected by any device on the network 34 may be used as a phase reference by any device on the network 34.

In addition to enabling phase and orbit plotting and analysis, embodiments described herein support calculations of covariance and correlation analysis, as well as calculations and reporting for various types of parameters, such as the following machine vibration related parameters. Parameter marked with an asterisks (*) in the list below require two inputs for cross-channel calculations and graphical representations including orbits.

Exemplary Output Parameters:
a. Total energy
b. Energy in a frequency band
c. Waveform Peak Value
d. Waveform Peak-to-Peak Value
e. Waveform 0-Peak Value
f. RMS of Waveform
g. SMAX*
h. SMAX p-p*
i. SMAX Change Vector*
j. nX Peak (up to 10 orders of turning speed)
k. nX Phase (up to 10 orders of turning speed)
l. Speed
m. Peak of Speed
n. Rotor Acceleration
o. Peak of PeakVue
p. Position
q. Absolute Position*
r. Thrust
s. Eccentricity
t. DC Gap
u. Scaled DC Gap (NGL)
v. Bias Voltage
w. Synchronous energy in a frequency band
x. Non-Synchronous energy in a frequency band
y. Relative synchronous harmonics
z. Variance of time waveform
aa. Skewness of time waveform
bb. Kurtosis of time waveform
cc. High frequency detection
dd. Variable high frequency detection
ee. Crest factor The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method for time synchronizing measurement signals that are indicative of an operational condition of a machine or process, which measurement signals are asynchronously acquired, the method comprising:
    (a) generating an analog measurement signal using a sensor attached to the machine or process;
    (b) generating an ADC clock signal and providing the ADC clock signal to an analog-to-digital converter;
    (c) converting the analog measurement signal to a digital measurement signal based on the ADC clock signal;
    (d) processing the digital measurement signal in a signal processor to generate processed time waveform data, wherein the processing introduces a processing delay time;
    (e) generating a tachometer signal using a tachometer sensor attached to the machine or process, the tachometer signal comprising tachometer pulses;
    (f) generating a synchronization signal comprising synchronization pulses;
    (g) measuring a first delay time from an edge of one of the synchronization pulses to a subsequent edge of the ADC clock signal;
    (h) calculating a second delay time from the edge of one of the synchronization pulses to a subsequent sample of the processed time waveform data;
    (i) measuring a third delay time from the edge of one of the synchronization pulses to a subsequent one of the tachometer pulses; and
    (j) embedding one or more of the first delay time, the second delay time, and the third delay time into the processed time waveform data.

2. The method of claim 1 further comprising:
    (k) providing the synchronization signal to a trigger input of a media access controller;
    (l) the media access controller latching a timer value based on a synchronization pulse being detected at the trigger input; and
    (m) a host processor receiving the timer value from the media access controller, receiving the processed time waveform data from the signal processor, generating timestamp data based on the timer value from the media access controller, and embedding a data record of synchronization pulses and the timestamp data into the processed time waveform data.

3. The method of claim 2 further comprising:
    (n) the host processor determining a synchronization time delay based on time differences between timestamp data embedded in processed time waveform data from multiple measurement devices; and
    (o) the host processor synchronizing the processed time waveforms from multiple measurement devices based at least in part on the synchronization time delay.

4. The method of claim 1 further comprising calculating a time delay (DeltaT) between a sample of the processed time waveform data and a subsequent tachometer pulse edge by:
    (k) calculating a first time (T1) from the edge of one of the synchronization pulses (Tsync) to the sample of the processed time waveform data according to:

$$T1 = T\text{sync} + (T\text{ADCdelay} + T\text{PhaseDelay}),$$

where TADCdelay is a time delay introduced by the analog-to-digital converter and TPhaseDelay is a time delay introduced by the signal processor; and (l) calculating a second time (T2) from the edge of one of the synchronization pulses (Tsync) to the subsequent one of the tachometer pulses according to:

$$T2 = T\text{sync} + T\text{TachOffset}$$

where TTachOffset is the time delay between the edge of one of the synchronization pulses (Tsync) to the subsequent one of the tachometer pulses, and (m) calculating the time delay (DeltaT) according to:

$$\text{Delta}T = T1 - T2 = (T\text{ADCdelay} + T\text{PhaseDelay}) - T\text{TachOffset}.$$

5. The method of claim 1 wherein the sensor is selected from the group consisting of an eddy current probe, an accelerometer, a motor current sensor, an ultrasonic sensor, a magnetic sensor, a temperature sensor, a pressure sensor, a flow rate sensor, a mass sensor, a relative humidity sensor, a load sensor, a density sensor, a composition sensor, a physical property sensor, a chemical property sensor, an electrical property sensor, a magnetic property sensor, an optical sensor, and an electromagnetic sensor.

6. The method of claim 1 wherein the signal processor comprises one or more field programmable gate arrays.

7. An apparatus for time synchronizing measurement signals that are indicative of an operational condition of a machine or process, which measurement signals are asynchronously acquired, the apparatus comprising:
   a sensor attached to the machine or process for generating an analog measurement signal;
   an ADC clock for generating an ADC clock signal;
   an analog-to-digital converter for receiving the ADC clock signal and the analog measurement signal and generating a digital measurement signal based on the ADC clock signal and the analog measurement signal;
   a tachometer sensor attached to the machine or process for generating a tachometer signal comprising tachometer pulses;
   a synchronization clock source for generating a synchronization signal comprising synchronization pulses; and
   a signal processor programmed to:
      process the digital measurement signal to generate processed time waveform data, wherein the processing introduces a processing delay time;
      measure a first delay time from an edge of a synchronization pulse to a subsequent edge of the ADC clock signal;
      calculate a second delay time from the edge of the synchronization pulse to a subsequent sample of the processed time waveform data;
      measure a third delay time from the edge of the synchronization pulse to a subsequent one of the tachometer pulses; and
      embed one or more of the first delay time, the second delay time, and the third delay time into the processed time waveform data.

8. The apparatus of claim 7 further comprising:
   a media access controller having a trigger input for receiving the synchronization signal, the media access controller operable to latch a timer value based on a synchronization pulse detected at the trigger input; and
   a host processor programmed to receive the timer value from the media access controller and generate timestamp data based thereon, to receive the processed time waveform data from the signal processor, and to embed a data record of synchronization pulses and the timestamp data into the processed time waveform data.

9. The apparatus of claim 7 wherein the signal processor comprises a field programmable gate array.

10. The apparatus of claim 7 wherein the sensor is selected from the group consisting of an eddy current probe, an accelerometer, a motor current sensor, an ultrasonic sensor, a magnetic sensor, a temperature sensor, a pressure sensor, a flow rate sensor, a mass sensor, a relative humidity sensor, a load sensor, a density sensor, a composition sensor, a physical property sensor, a chemical property sensor, an electrical property sensor, a magnetic property sensor, an optical sensor, and an electromagnetic sensor.

\* \* \* \* \*